United States Patent
Ikegami

[19]

[11] Patent Number: 5,851,880
[45] Date of Patent: Dec. 22, 1998

[54] METHOD OF MAKING NONVOLATILE MEMORY ELEMENTS WITH SELECTOR TRANSISTORS

[75] Inventor: Masami Ikegami, Tokyo, Japan

[73] Assignee: Oki Electric Industry Co., Ltd., Tokyo, Japan

[21] Appl. No.: 820,650

[22] Filed: Mar. 18, 1997

[30]     Foreign Application Priority Data

Jun. 14, 1996 [JP] Japan .................................. 8-175506

[51] Int. Cl.⁶ .............................................. H01L 21/8247
[52] U.S. Cl. ........................................ 438/258; 438/588
[58] Field of Search ................................... 438/257, 258, 438/266, 267, 587, 588, 593, 594, 675

[56]           References Cited

U.S. PATENT DOCUMENTS

| | | | |
|---|---|---|---|
| 4,780,431 | 10/1988 | Maggioni et al. | 438/258 |
| 4,822,750 | 4/1989 | Perlegos et al. | 438/258 |
| 5,597,750 | 1/1997 | Pio et al. | 438/588 |
| 5,702,966 | 12/1997 | Noda et al. | 438/258 |

FOREIGN PATENT DOCUMENTS 4-123470  4/1992  Japan .

*Primary Examiner*—Chandra Chaudhari
*Attorney, Agent, or Firm*—Spencer & Frank

[57]               ABSTRACT

A simplified manufacturing process of a semiconductor memory 10, in which after a layer-built structure is formed of a control-gate conductive layer 19, an intergate insulating film 17, and a floating-gate conductive layer 18, a contact hole for a connector 21 for connecting the floating-gate conductive layer 18 and the control-gate conductive layer 19 together is formed in two stages: by forming a first contact hole 24 passing through the control-gate conductive layer 19 and opening above the intergate insulating film 17, and then forming a second contact hole 26 passing through the intergate insulating film 17 and opening to the floating-gate conductive layer 18, and the first contact hole 24 is formed in conjunction with patterning of a control gate g1, and the second contact hole 26 is formed in conjunction with the formation of a drain contact hole 20.

6 Claims, 8 Drawing Sheets

METHOD OF MAKING NONVOLATILE MEMORY ELEMENTS WITH SELECTOR TRANSISTORS

BACKGROUND OF THE INVENTION

1. Field of the Invention

The present invention relates to a semiconductor memory and a manufacturing method for this semiconductor memory, and more particularly to a semiconductor memory comprising a plurality of nonvolatile semiconductor memory elements arranged in a matrix formation and a plurality of selector transistors for selecting memory elements, and a manufacturing method for this semiconductor memory.

2. Prior Art

In a semiconductor memory called a flash memory capable of batch erasure of data in the memory, memory elements having floating gates serving as nonvolatile semiconductor memory elements are arranged in a matrix formation, and selector transistors for selecting the memory elements by the row are formed on one semiconductor substrate.

For the selector transistors, a MOS transistor is adopted which utilizes the layer-built structure for the memory elements, including a floating-gate conductive layer, an intergate insulating layer, and a control-gate conductive layer.

In order to fabricate the selector transistor by utilizing the multi-layered structure for the memory element, the floating gate layer, which is not required for the selector transistor, and the control gate layer are electrically connected. For this electrical connection, a contact hole is formed which passes through the intergate insulating layer and opening above the floating-gate conductive layer, and in this contact hole, a connector is formed which is made of a metallic material for short-circuiting the floating gate and the control gate of the selector transistor to enable a selector transistor to be built utilizing the multi-layered structure of the memory element.

In the conventional manufacturing method mentioned above, however, the contact hole forming process is performed independently of the other processes, and therefore a special-purpose mask, and dedicated photolithographic and etching processes are required for forming the contact holes, which is responsible for the complicated contact hole manufacturing process.

Further, in the conventional manufacturing method, in the etching step for forming contact holes, to ensure protection from damage by etchant to the intergate insulating layer in the memory element regions, it is necessary to form the gate layer covering the intergate insulating layer in a double-layer structure including a first conductive layer made chiefly of a polysilicon with relatively high resistance to etchants and a second conductive layer made of a metal, the contact holes must be formed under the condition that the intergate insulating layer of the memory element region is protected by the first conductive layer which has been previously deposited. It is indispensable to form the gate layer in the double-layer structure, a fact which makes the manufacturing process pretty complicated.

SUMMARY OF THE INVENTION

It is an object of the present invention to provide a simplified manufacturing process of a semiconductor memory.

It is another object of the present invention to provide a simplified semiconductor memory in construction.

In order to solve the above problems, the present invention adopts the arrangements as follows.

According to the present invention, a method of manufacturing a semiconductor memory having a plurality of memory elements arranged in a matrix formation on a semiconductor substrate, each memory element having a floating gate and a control gate, and also having selector transistors mounted, each provided with a gate, for selecting the memory elements, comprises the steps of:

forming a floating-gate conductive layer, an intergate insulating layer, and a control-gate conductive layer on a semiconductor substrate, including a memory element region portion and a selector transistor region portion in each active region of the semiconductor substrate;

in conjunction with patterning of control gates forming each word line by preferential etching of the control-gate conductive layers, the intergate insulating film, and the floating-gate conductive layers, forming a first contact hole passing through the control-gate conductive layer and opening above the intergate insulating layer in that portion of the control gate which is close to each selector transistor region portion;

forming source and drain regions in each memory element region portion and in each selector transistor region portion;

after covering the surface of the substrate with an interlayer insulating film, forming a drain contact hole passing through the interlayer insulating film and opening to each drain region, and simultaneously forming a second contact hole passing through the first contact hole portion and the intergate insulating layer and opening to each floating-gate conductive layer; and forming bit lines each passing through the drain contact hole and contacting to the drain region, and simultaneously forming a connector passing through the first and second contact holes and connecting the floating-gate conductive layer and the control-gate conductive layer together in each selector transistor.

In the manufacturing method according to the present invention, after a multi-layered structure including the control-gate conductive layer, the intergate insulating film, and the floating-gate conductive layer, is formed, the contact hole for the connector connecting the floating-gate conductive layer and the control-gate conductive layer is formed by separately forming a first contact hole passing through the control-gate conductive layer and opening to the intergate insulating layer, and a second contact hole passing through the intergate insulating layer and opening to the floating-gate conductive layer.

The first contact hole is formed in conjunction with patterning the control gate, and the second contact hole is formed in conjunction with the formation of the drain contact hole, so that the formation of each of the first and second contact holes is done simultaneously with the working process including photolithography.

Therefore, it is not necessary to perform the dedicated process for the contact holes, prepare a special-purpose mask, and carry out the dedicated photolithographic and etching processes only for the contact holes as in the prior art, making it possible to simplify the manufacturing process.

In the above-mentioned manufacturing process according to the present invention, in the contact hole passing through the intergate insulating layer, the greater part of the intergate insulating layer is covered with the control-gate conductive layer and the interlayer insulating film, and forms a part of the second contact hole. For this reason, the control-gate conductive layer is not required to have a protective property against etching as it used to. Therefore, the intergate insulating layer in the memory element region is prevented securely from being damaged by etching without adopting for the control-gate conductive layer the double-layer structure including a polycrystal layer as in the prior art.

Therefore, the present invention enables a single-layer structure formed of a metallic material for the control-purpose conductive layer, thus making it possible to simplify the structure of the semiconductor memory and its manufacturing process.

Preferably, the bit lines and the connectors are formed by sputtering a metal material with a mask for manufacture with ease and high precision.

For the control-gate conductive layer, a conventional double-layer structure may be adopted which is formed by depositing a metallic conductive layer portion on a polycrystal conductive layer portion doped with impurities.

Preferably, the top end bore of the second contact hole is made larger than the bore of the first contact hole for facilitating the formation of the contact hole for connecting the control gate layer with the floating gate layer, and the second contact hole is formed by etching using an etchant more effective to insulating materials than metallic materials.

Preferably, the first and second contact holes are formed coaxially to improve the matching between the two kinds of holes.

In case the control-gate conductive layer is formed in a conventional double-layer structure, for example and is highly protective to the intergate insulating layer against etching, the semiconductor memory can be fabricated by forming a floating-gate conductive layer, an intergate insulating layer, and a control-gate conductive layer on a semiconductor substrate, including a memory element region portion and a selector transistor region portion in each active region partitioned by an isolation region of the semiconductor substrate;

patterning control gates forming each word line by preferential etching of the control-gate conductive layers, the intergate insulating film, and the floating-gate conductive layers, and simultaneously forming a first contact hole passing through the control-gate conductive layer, the intergate insulating layer and the floating-gate conductive layer, and opening above the isolation region in that portion of the control gate which is close to each selector transistor region portion;

subsequently, after covering the surface of the substrate with an interlayer insulting film, forming a drain contact hole passing through the interlayer insulting film and opening to each drain region, and simultaneously forming a second contact hole passing through the first contact hole portion and opening to each isolation region; and forming bit lines each passing through the drain contact hole and contacting to the drain region, and simultaneously forming a connector passing through the first and second contact control-gate conductive layer together in each selector transistor.

By arranging a simultaneous process of patterning the control gates forming the word lines and forming the first contact holes, the control gates and the first contact holes can be patterned simultaneously with a single mask pattern. Accordingly, it becomes unnecessary to consider allowable errors in relative positioning of the control gates and the first contact holes in the photolithographic step, which must be considered when patterning is done separately for the control gates and the first contact holes. Therefore, the amount of space corresponding to provided allowable errors can be reduced in the memory, so that the memory size can be reduced.

According to the present invention, a semiconductor memory comprises a first memory block; and a second memory block, each memory block comprising:
    a plurality of memory elements arranged in a matrix formation on a semiconductor substrate, each memory element including a floating gate and a control gate, the control gates in each row being connected to a word line; and
    a plurality of selector transistors, each selector transistor with a gate connected to the row of memory elements being used to select a corresponding row of memory elements, wherein each selector transistor comprises a gate of a multi-layered structure of a floating-gate conductive layer, an intergate insulating layer, and a control-gate conductive layer, formed on a semiconductor substrate with interposition of an insulating layer between source and drain regions in the semiconductor substrate, the multi-layer-structured gate being an electrically integral body composed by connecting the floating-gate conductive layer and the control-gate conductive layer with a connector, and wherein each pair of the selector transistors located in the opposite memory blocks but sharing the same word line share one connector.

In the semiconductor memory according to the present invention, in the selector transistors for selecting corresponding rows of memory elements in either of the memory blocks, each pair of selector transistors sharing the same word line share one connector connecting their floating-gate conductive layers and control-gate conductive layers. Therefore, it is not necessary to provide separate connectors corresponding to the number of selector transistors.

Accordingly, the semiconductor memory according to the present invention enables the simplification and the downsizing of the manufacturing process.

In an aspect, the semiconductor memory according to the present invention adopts a floating gate type transistor, such as the so-called MOS transistor, and comprises a plurality of memory elements arranged in a matrix formation, each memory element including a floating gate and a control gate, the control gates in each row being connected to a word line; and a plurality of selector transistors, each selector transistor with a gate connected to the row of memory elements being used to select a corresponding row of memory elements, wherein the selector transistor comprises a floating gate and a control gate, the control gate of the selector transistor is connected as a gate to the word line, and the floating gate of the selector transistor is set in uncharged state.

The selector transistor with the floating gate in the non-conducting state has the drain current turned on and off by the presence or absence of a voltage applied to the gate, and therefore performs the same selection action on the row of memory elements.

Therefore, the selector transistor can be fabricated without forming a connector or the like for short-circuiting the control gate and the floating gate as in the prior art, for which reason the structure of the semiconductor memory and its manufacturing process can be simplified.

DESCRIPTION OF PREFERRED EMBODIMENTS

The preferred embodiments of the present invention will be described in detail in the following.

<First Embodiment>

FIGS. 1(a) to 1(f) are sectional views of process steps of a first embodiment of a manufacturing process of the semiconductor memory according to the present invention. Before describing the manufacturing process. a semiconductor memory shown in FIGS. 2 to 5 fabricated by this manufacturing process will first be described.

Figure 2:
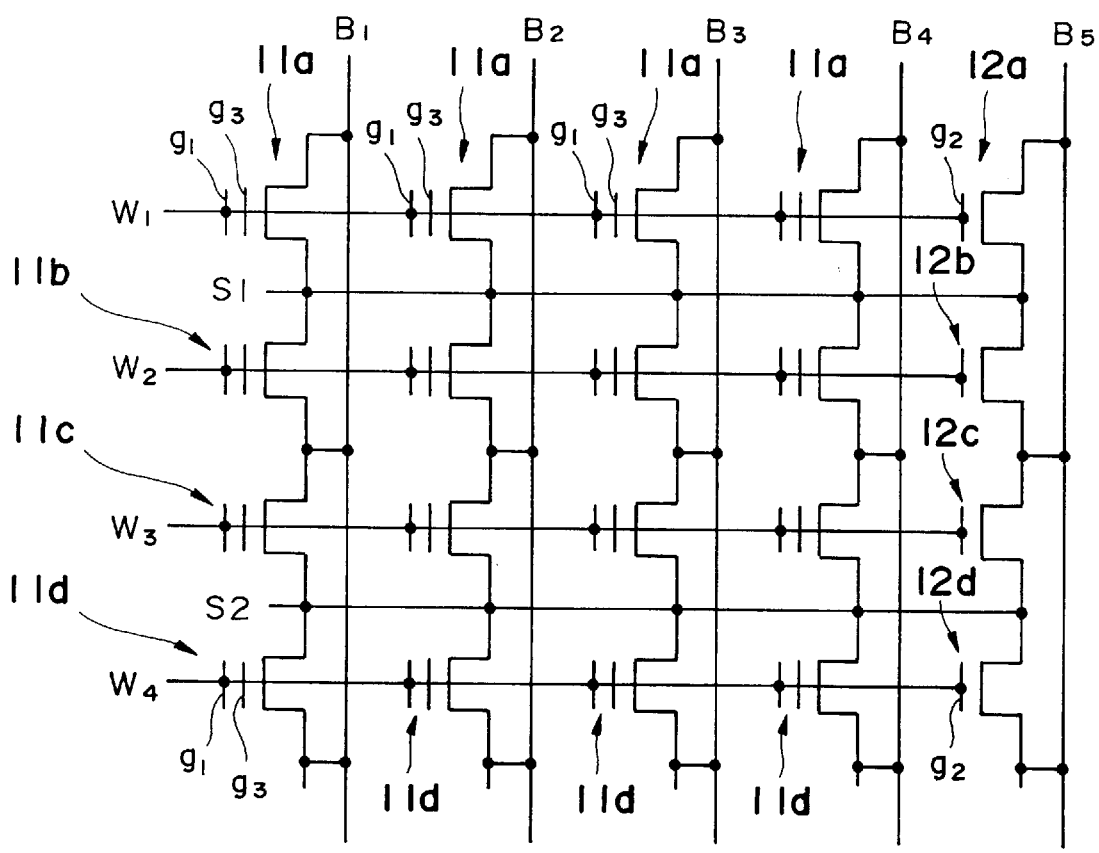
FIG. 2 is a circuit diagram of the semiconductor memory according to the present invention.

In the example of a circuit diagram shown in FIG. 2, a semiconductor memory 10 according to the present invention includes 16 nonvolatile memory elements 11 (11a to 11d) arranged in a 4×4 matrix, and four selector transistors 12 (12a to 12d) disposed to correspond to the horizontal rows of memory elements (11a, 11b, 11c and 11d), and all those components are thus arranged in a matrix formation.

Word lines W1 to W4 and source lines S (S1 and S2) are extending in the horizontal direction of FIG. 2. The word lines W1 to W4 are connecting control gates g1 of the memory elements 11 (11a, 11b, 11c and 11d) of each row with control gates g2 of the selector transistors 12 (12a, 12b, 12c and 12d) corresponding to the respective rows of memory elements, and source lines S (S1, S2) are connecting sources of the memory elements of the respective rows. Bit lines B1 to B4 connecting drains of the memory elements 11 (11a, 11b, 11c and 11d) of the columns arranged in the vertical direction of FIG. 2 and a bit line B5 connecting drains of the selector transistors 12 are extending in the vertical direction.

In this memory circuit, if a read signal is input to the word line W1 and the bit line B1, for example, the current flowing to the source line S1 is changed according to the charged or not charged state of the floating gate g3 of the memory element 11a at the uppermost and extreme left intersection of B1 and W1 in FIG. 2. In other words, if a charge is stored at the floating gate g3, basically, a current does not flow to the source line S1, but if a charge is not stored at the floating gate g3, basically, a current flows to the source line S1. Therefore, by detecting the presence and absence of the current in the source line S1, the stored data in the related memory element 11 can be read.

When reading a current on the source line S1, only the selector transistor 12a connected to the word line W1 is conducting from drain to source, while the other selector transistors 12b to 12d are in the nonconducting state. Consequently, the memory elements 11a in the row corresponding to the selector transistor are selectively put in the state of conducting to the bit line B5, and even if a dark current flows in any of the memory elements 11b to 11d of other rows, the dark current is prevented from flowing into the source line S1, which ensures prevention of a read error caused by the dark current.

Writing and batch erasure of information on the memory elements 11 of this memory circuit can be done as in the prior art by charge injection into the floating gates g3 or batched discharge from the floating gates g3, and therefore detailed description is omitted.

Figure 3:
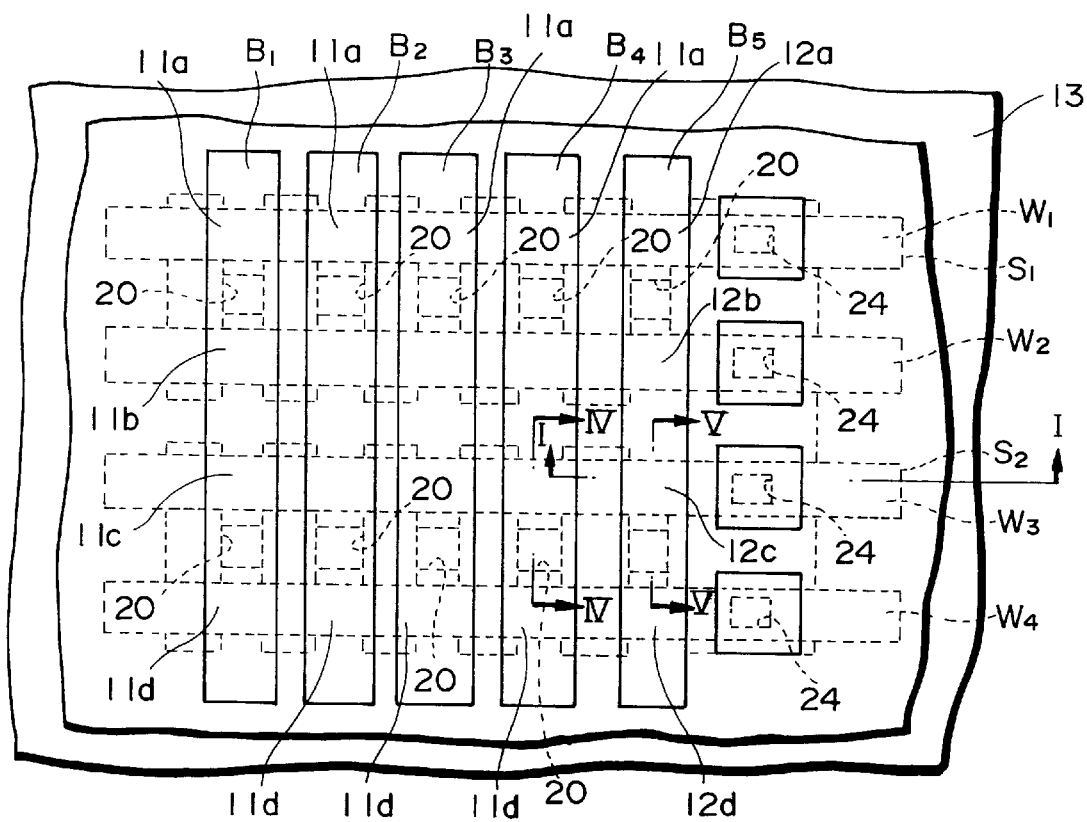
FIG. 3 is a plan view of the semiconductor memory according to the present invention.

FIG. 3 is a plan view of the semiconductor memory 10 embodying the circuit shown in FIG. 2.

In the semiconductor memory 10, the bit lines B1 to B5 and the word lines Wi to W4 are arranged intersecting perpendicularly to each other on a p-type semiconductor substrate 13, for example. Although not illustrated, the source lines S1 and S2 extend beneath the word lines W1 and W3 in the semiconductor substrate 13.

Figure 4:
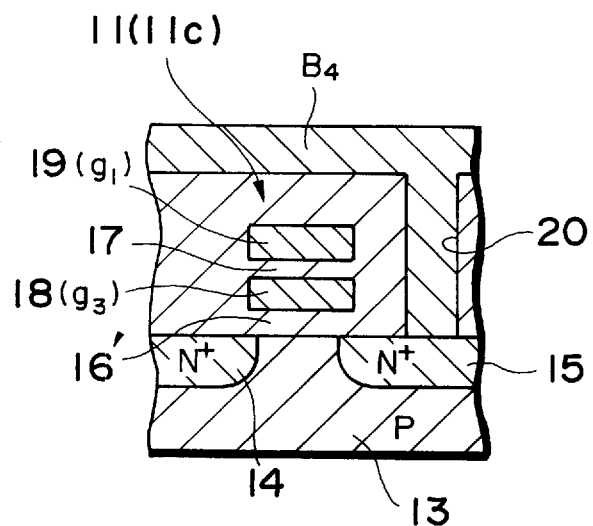
FIG. 4 is a sectional view taken along the line IV—IV shown in FIG. 3.

As shown in FIG. 4 taken along the line IV—IV in FIG. 3, a memory element 11 (11a to 11d) is formed below a bit line B (B1 to B4). In F1G. 4, each memory element 11 indicated by a symbol 11c includes an n+-type source region 14 and an n+-type drain region 15 spaced apart from each other in the semiconductor substrate 13, and also includes a floating gate g3 formed of a floating-gate conductive layer 18 and a control gate g1 formed of a control-gate conductive layer 19 which are both located above the semiconductor substrate 13 between both n+ regions 14, 15, and the floating gate g3 and the control gate g1 have an intergate insulating film 17 located between them. A gate insulating film 16' is located between the substrate 13 and the floating gate g3.

The respective bit lines B1 to B4 pass through drain contact holes 20 open above the drain regions 15 of the memory elements 11 of the rows intersecting the bit lines and are connected to those drain regions 15. The source regions 14 of the memory elements 11a, 11b, 11c and 11d of the respective columns are connected with the source lines S1 and S2 extending close to each source region 14 as in the prior art, though this is not illustrated.

Figure 5:
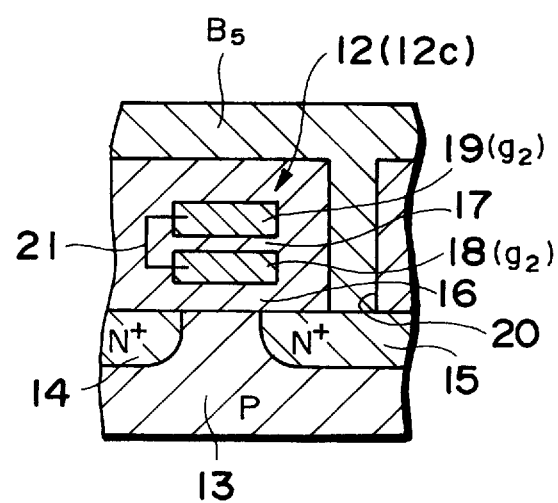
FIG. 5 is a sectional view taken along the line V—V shown in FIG. 3.

As shown in FIG. 5 taken along the line V—V in FIG. 3, selector transistors 12 (12a to 12d) are formed below the bit line B5 in such a manner as to correspond to the rows of the memory elements 11. In FIG. 5, like in the memory element 11, each selector transistor 12 indicated by symbol 12c includes an n+ source region 14 and an n+ drain region 15 spaced apart from each other in the semiconductor substrate 13, and also includes a floating-gate conductive layer 18 and a control-gate conductive layer 19 which are both located above the semiconductor substrate 13 between both n+ regions 14, 15, and the floating-gate conductive layer 18 and the control-gate conductive layer 19 have an interlayer insulating film 17 located between them. A gate insulating film 16 is located between the substrate 13 and the floating-gate conductive layer 18.

In the selector transistor 12, the gate g3 formed of the floating-gate conductive layer 18 and the gate g1 formed of the control-gate conductive layer 19 are connected together across a connector 21, and by this electrical connection, both gate g1 and g3 become electrically integral with each other, thus forming a gate g2 of each selector transistor 12.

The bit line B5 passes through a drain contact hole 20 opening above the drain region 15 of a selector transistor 11 and is connected to the drain region 15. The source regions 14 of the memory elements 11a, 11b, 11c and 11d of each column are connected with the source lines S1 and S2 extending close to each source region 14 as in other bit lines B1 to B4.

The semiconductor memory 10 mentioned above is a well-known nonvolatile flash memory using MOS nonvolatile memory elements for the memory elements 11. A method of manufacturing a semiconductor memory according to the present invention will be described with reference to the semiconductor memory 10 mentioned above as an example.

FIGS. 1(a) to 1(f) are longitudinal sectional views taken along the line I—I in FIG. 3.

Figure 1A:
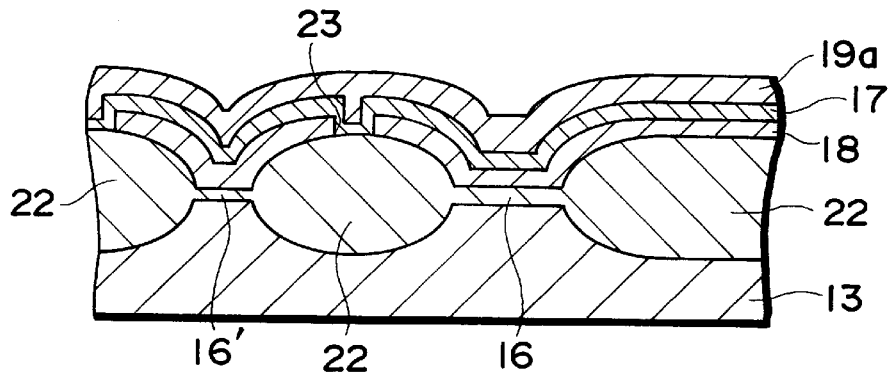
FIGS. 1(a)–1(f) are sectional views showing the process of a first embodiment of the method of manufacturing a semiconductor memory according to the present invention.

The semiconductor substrate 13 is a p-type silicon semiconductor substrate, for example. As shown in FIG. 1(a), in the semiconductor substrate 13, a memory element region for forming a memory element 11 and a selector transistor region for forming a selector transistor 12 are partitioned by an isolation region 22 using the well-known LOCOS method, for example.

Thereafter, a gate insulating film 16 500 A. U. thick. for example, for a selector transistor 12 is formed in the selector transistor region, and a gate insulating film 16' 100 A. U. thick, for example. to serve as the gate insulating film for a memory element 11 is formed in the memory element region.

Both insulating films 16 and 16'can be respectively formed by heattreating the semiconductor substrate 13 under a atmosphere of steam, for example.

The gate insulating films 16 and 16' and the isolation region 22 on the semiconductor substrate 13 are covered with a floating-gate conductive layer 18. The floating-gate conductive layer 18 can be formed by depositing a polysilicon, for example, to a thickness of 1000 A. U., and then injecting impurity ions, such as phosphorus ions, into the polysilicon layer in a concentration of 1015 ion/cm2. The floating-gate conductive layer 18 is patterned to be partitioned into a floating gate portion (g3) for a memory element 11 and a gate portion (g2) for a selector transistor 12, and thus the two gate portions (g2 and g3)are electrically cut off from each other by a gap 23. An intergate insulating film 17 with a thickness of 200 A. U. is formed. for example, by thermal oxidation to cover the whole surface of the floating-gate conductive layer 18, by which the gap 23 is also covered. The intergate insulating film 17 is covered, for example, with a polysilicon deposited to a thickness of 1000 A. U., and then a lower layer portion 19a as a component of the control-gate conductive layer 19 is formed by a polysilicon with an impurity concentration of about 1020 ion/cm2 by thermal diffusion of phosphorus, for example.

Figure 1B:
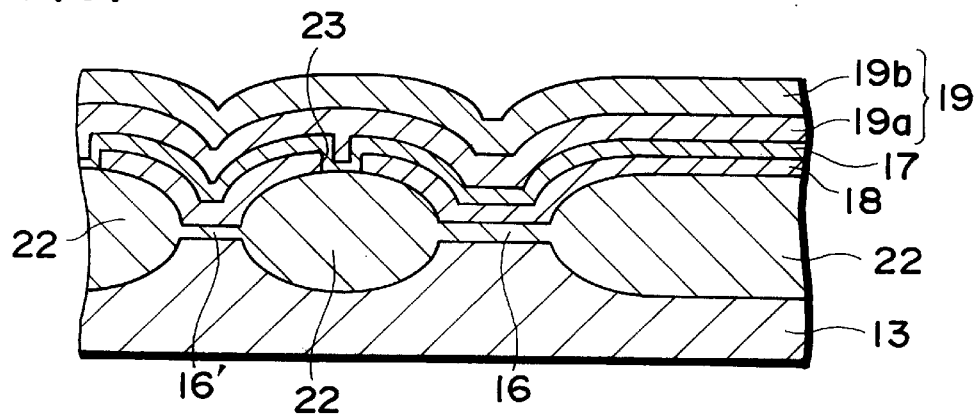

As shown in FIG. 1(b), an upper layer portion 19b is formed to cover the lower layer portion 19a. The upper layer portion 19b is formed by sputtering a high-melting metallic material, such as tungsten, for example, to a thickness of 1000 A. U., for example, on the lower layer 19a.

In the illustrated example, as mentioned above, a control-gate conductive layer 19 of a double-layer structure is adopted which includes the lower layer portion 19a of polysilicon and the upper layer portion 19b of a metallic material. As described, the lower layer portion 19a and the upper layer portion 19b are made of different materials, that is, polysilicon and a metal, so that the control-gate conductive layer 19 having a double-layer structure exhibits two different kinds of resistance against different kinds of etchants.

The control-gate conductive layer 19 is patterned by photolithographic and etching techniques to be formed as the word lines W1 to W4.

Figure 1C:
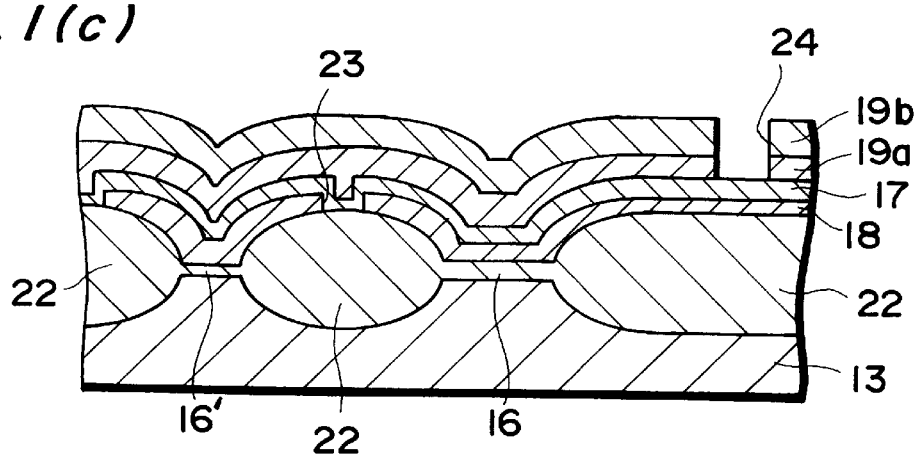

In this patterning, as shown in FIG. 1(c), a first contact hole 24 is formed by preferential etching in the vicinity of the gate insulating film 16 of the selector transistor 12, which leads through the control-gate conductive layer 19 to the intergate insulating film 17.

This first contact hole 24 does not pass through the intergate insulating film 17 and moreover the intergate insulating film 17 is completely covered by the control-gate conductive layer 19 so as to be separate from the regions of the memory element 11 and the selector transistor 12, for which reason the intergate insulating film 17 is never subject to damage by the regions of those elements.

Simultaneously with the formation of the first contact hole 24, the control-gate conductive layer 19 undergoes framing by etching so that the conductive layer 19 is located in the semiconductor substrate 13. The control-gate conductive layer 19, after undergoing the framing, is next subjected to patterning.

By the above patterning, a multi-layered structure, including the memory element control gate a1 composed of the control-gate conductive layer 19 and the lower floating gate g3 composed of the floating-gate conductive layer 18, is left behind in the region of the memory element 11. In the region of the selector transistor 12, a multi-layered structure, including the selector-transistor gate g2 composed of the floating-gate conductive layer 18 and the gate g2 composed of the control-gate conductive layer 19, is left behind.

Therefore, the unwanted portions of the control-gate conductive layer 19, the intergate insulating film 17, and the floating-gate conductive layer 18 are removed.

As described, in conjunction with the patterning to form the word lines W1 to W4, in other words, simultaneously with the framing of the control-gate conductive layer 19, the first contact hole 24 is formed, so that the first contact hole 24 can be formed without performing the photolithographic and etching processes dedicated to the forming of the first contact hole.

The deposition of the control-gate conductive layer 19 ensures the prevention of damage to the intergate insulating film 17 caused by etching.

In forming the first contact hole 24 and the word lines W1 to W4 by patterning the control-gate conductive layer 19, a single mask including a mask portion for the first contact holes 24 and a mask portion for the word lines may be used. By using this mask, batch patterning to form the first contact holes and the word lines W1 to W4 can be performed simultaneously. By so doing, it becomes possible to obviate the necessity to consider allowable errors in relative positioning of the word lines and the first contact holes in the photolithographic process, which must be taken into consideration when two separate masks are used.

Therefore, to achieve the size reduction of the semiconductor memory by elimination of the provided space for allowable errors, it is desirable to conduct batch patterning to form the first contact holes and the word lines with one mask pattern.

After forming the word lines W1 to W4, by using this mask, impurities such as arsenic, for example, are implanted into predetermined regions of the semiconductor substrate 13 with acceleration energy of 60 keV to attain a dopant concentration of 1015 ion/cm2, for example. By this ion implantation, the source regions 14 and the drain regions 15 of the memory element 11 and the selector transistor 12 are formed.

Figure 1D:
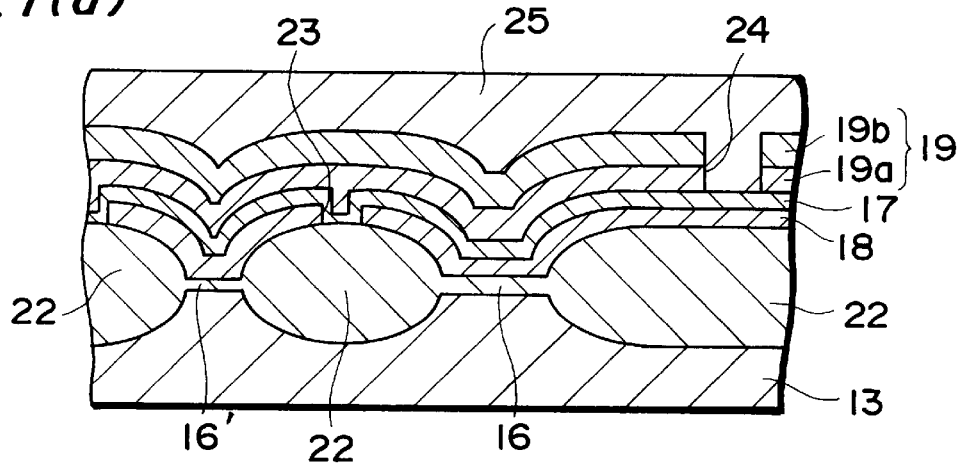

Subsequently, as shown in FIG. 1(d), an interlayer insulating film 25 formed of a BPSG film, for example, with a thickness of 10000 A. U., for example, is formed to cover the whole surface of the semiconductor substrate 13.

Figure 1E:
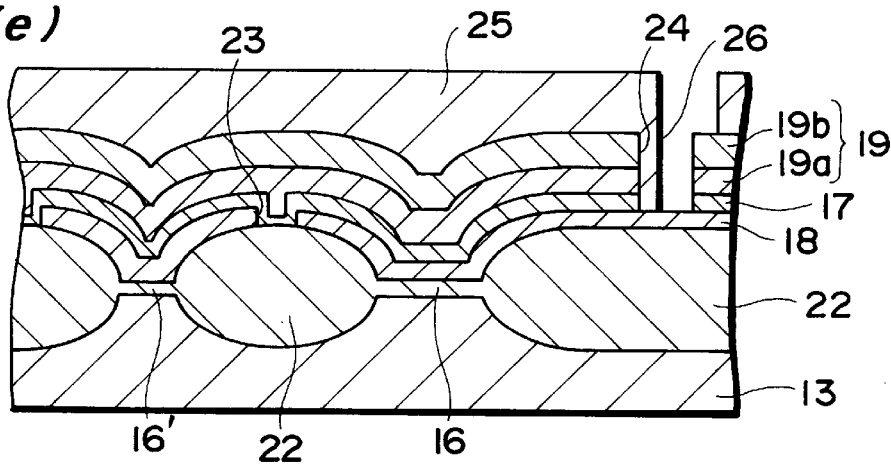

After forming the interlayer insulating film 25, a drain contact hole 20 (FIGS. 3 to 5), which passes through the interlayer insulating film 25 and opens above the drain regions 15 of the memory element 11 and the selector transistor 12, is formed. Simultaneously with the formation of the drain contact hole 20, as shown in FIG. 1(e), a second contact hole 26 is formed, which passes through the first contact hole 24, the interlayer insulating film 25, and the intergate insulating film 17 and opens above the floating-gate conductive layer 18.

The drain contact hole 20 and the second contact hole 26 are formed using the photolithographic and etching techniques, and the two kinds of holes 20, 26 can be formed by batch processing in the photolithographic process with a mask including mask portions to form the two kinds of holes 20, 26 simultaneously.

In the etching process, since the interlayer insulating film 25 and the intergate insulating film 17 are formed of an insulating material, an etchant is used which shows excellent etching effects on this insulating material.

Figure 1F:
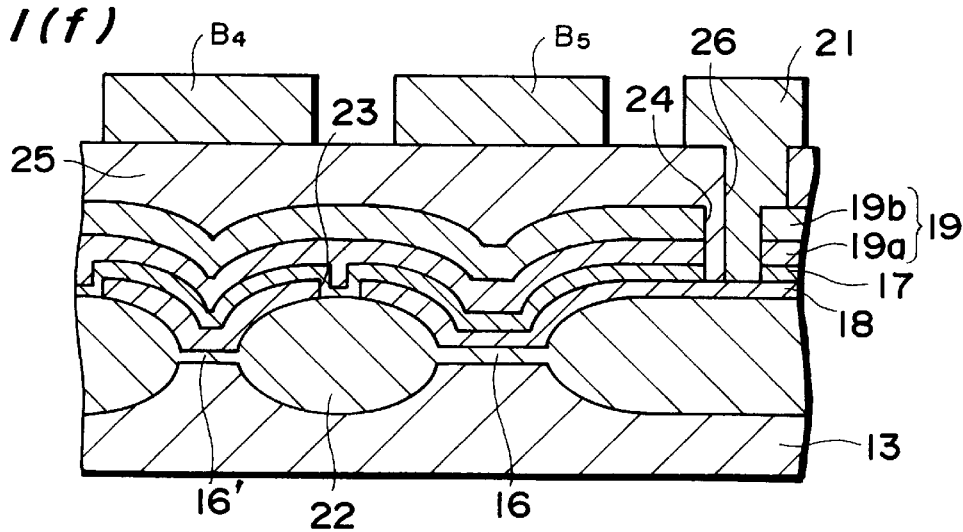

After the second contact hole 26 passing through the first contact hole 24 and open above the floating-gate conductive layer 18 are formed, as shown in FIG. 1(f), the bit lines B1 to B5 are formed by sputtering using a metallic material, for example, and simultaneously with this, a connector 21 is formed which extends through the second contact hole 26.

The bit lines B1 to B5 extend through the drain contact holes 20 and connect to the corresponding drain regions 15 (FIGS. 3 to 5).

The connector 21 extending in the second contact hole 26 connects the control-gate conductive layer 19 and the floating-gate conductive layer 18.

Connected by this connector 21, the floating-gate conductive layer 18 and the control-gate conductive layer 19 in the selector transistor 12 become electrically integral with each other, thus enabling the selector transistor 12 to function as an ordinary transistor.

In a first embodiment, the first contact holes 24 are formed in conjunction with patterning of the gates g1, g2 and g3 to create the word lines W1 to W5, and the second contact holes 26 are formed in conjunction with the formation of the drain contact holes 20, for which reason in each case, a simultaneous working process, including a photolithographic step of the other kind of components, can be carried out.

Therefore, the special-purpose mask, and the dedicated photolithographic step and etching step only for the first or the second contact holes can be done away with, and a dual-purpose mask and a combined photolithographic step and a combined etching step may be used, so that the manufacturing process can be simplified.

A single-layer structure formed of a metallic material may be adopted for the control-purpose conductive layer, and by adoption of this single-layer structure, the device structure and the manufacturing process can be further simplified.

<Second Embodiment>

Figure 6:
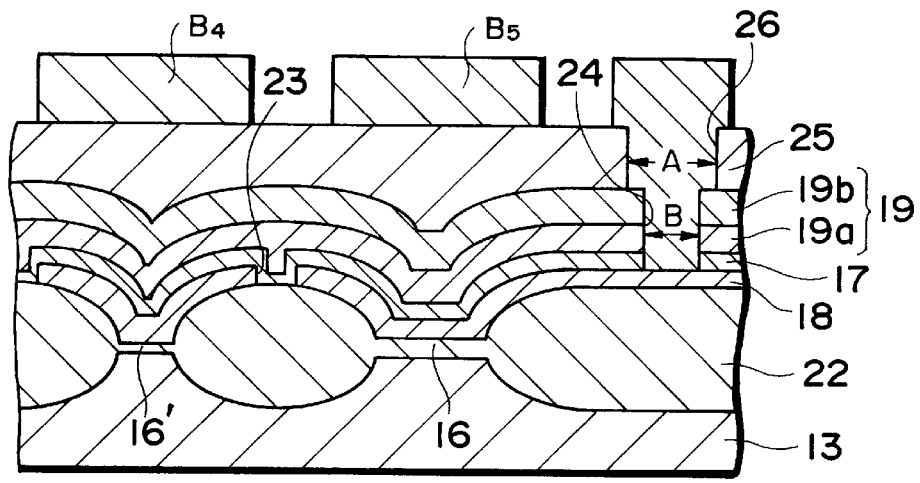
FIG. 6 is a sectional view sh owing the process of a second embodiment of the method of manufacturing the semiconductor memory according to the present invention.

As shown in FIG. 6, preferably, the first contact hole 24 passing through the control-gate conductive layer 19 and the second contact hole 26 passing through the interlayer insulating film 25 and the intergate insulating film 17 are formed coaxially, and the diameter A of the top end bore 26a of the second contact hole is preferably larger than the bore diameter B of the first contact hole 24.

By setting the top end bore diameter A of the second contact hole 26 so as to be larger than the bore diameter B of the first contact hole 24, an error margin greater than about 0.2 microns can be secured for positioning the mask to form the second contact hole 26. By arranging the contact holes 24 and 26 coaxially, the matching of the contact holes 24 and 26 can be improved, and the floating-gate conductive layer 18 and the control-gate conductive layer 19 of the selector transistor 12 can be connected more securely.

<Third Embodiment>

In the first and second embodiments, examples are shown in which the intergate insulating film 17 passes through the second contact hole 26 without letting the first contact hole 24 pass through the intergate insulating film 17.

Instead, as shown in FIGS. 7(i a) and 7(b), the first contact hole 24 may be formed to pass through the intergate insulating film 17, and open above the isolation region 22.

Figure 7A:
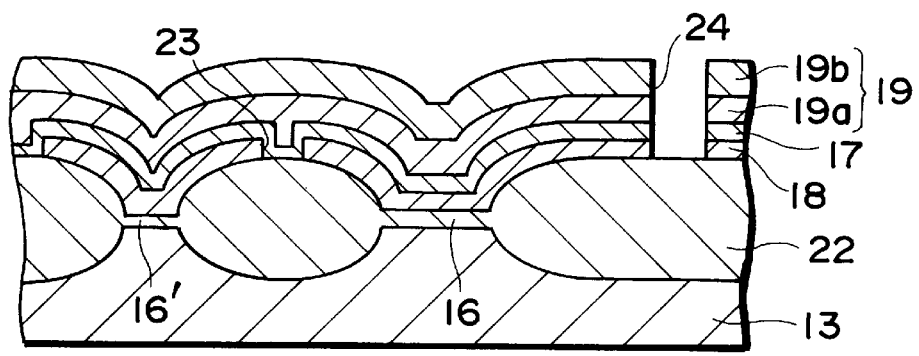
FIGS. 7(a)–7(b) are sectional views showing the process of a third embodiment of the method of manufacturing the semiconductor memory according to the present invention.

As shown in FIG. 7(a), if the control-gate conductive layer 19 is in a double-layer structure (19a and 19b) superior in performance of protecting the intergate insulating film 17, the first contact hole 24 may be formed to pass through the intergate insulating film 17 and the floating-gate conductive layer 18 and open above the isolation region 22.

Simultaneously with the formation of the first contact hole 24, the word lines W1 to W4 are formed by patterning the control-gate conductive layer 19.

After the word lines W1 to W4 are formed, as in the first embodiment, the source regions 14 and the drain regions 15 of the memory element 11 and the selector transistor 12 are formed.

Figure 7B:
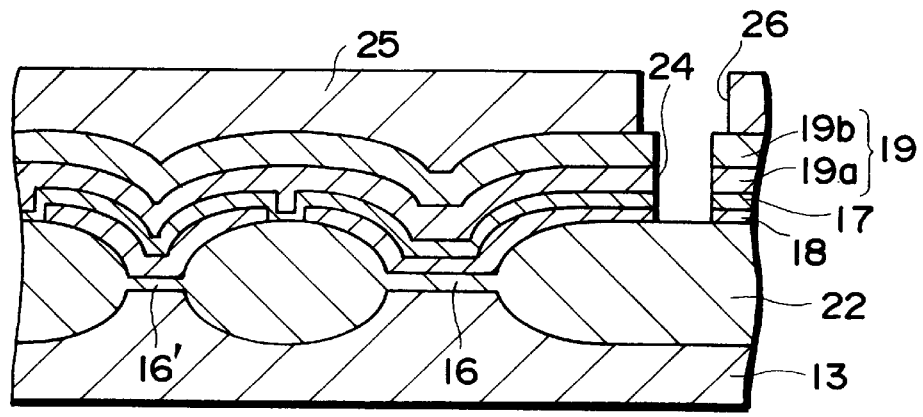

Further, referring to FIG. 7(b), as in the first embodiment, the interlayer insulating film 25 is formed, a second contact hole 26 is formed which passes through the first contact hole 24 and opens above the isolation region 22.

Though not illustrated, simultaneously with the formation of the second contact hole 26, the drain contact hole 20 is formed, and the bit lines B1 to B5 and the connector 21 similar to those mentioned above are formed in conjunction with those holes 20 and 26.

In a third embodiment, a single patterning mask including a mask portion for the first contact holes 24 and a mask portion for the word lines may be used. By using this mask, batch patterning to form the first contact holes 24 and the word lines W1 to W4 can be performed. By so doing, it becomes possible to obviate the necessity to consider allowable errors in relative positioning of the word lines and the first contact holes in the photolithographic process, which must be considered when patterning is done separately, so that the space provided for such allowable errors can be eliminated and the side of the semiconductor memory 10 can be reduced.

<Fourth Embodiment>

In the first to third embodiments, the semiconductor memory 10 has been described in which a selector transistor is mounted for each row of the memory elements 11 (11a to 11d), but in a fourth embodiment, two selector transistors 12 are mounted for each row of memory elements.

Figure 8:
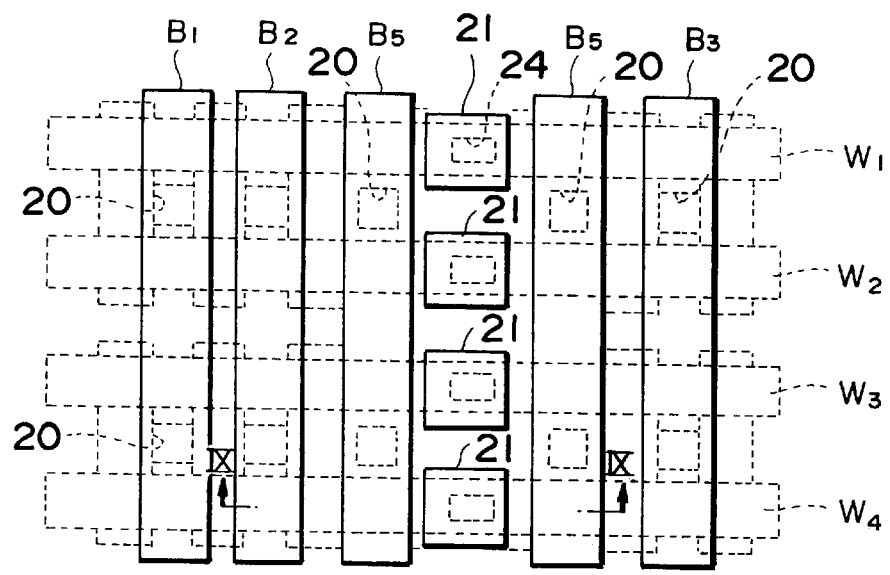
FIG. 8 is a plan view showing another embodiment of the semiconductor memory according to the present invention.

In the semiconductor memory 10 shown in FIG. 8, the memory elements 11 same as those mentioned above are arranged under the three bit lines B1 to B3, and the selector transistors 12 are arranged under the bit lines B5, B5 formed symmetrically about a column of connectors 21.

Figure 9:
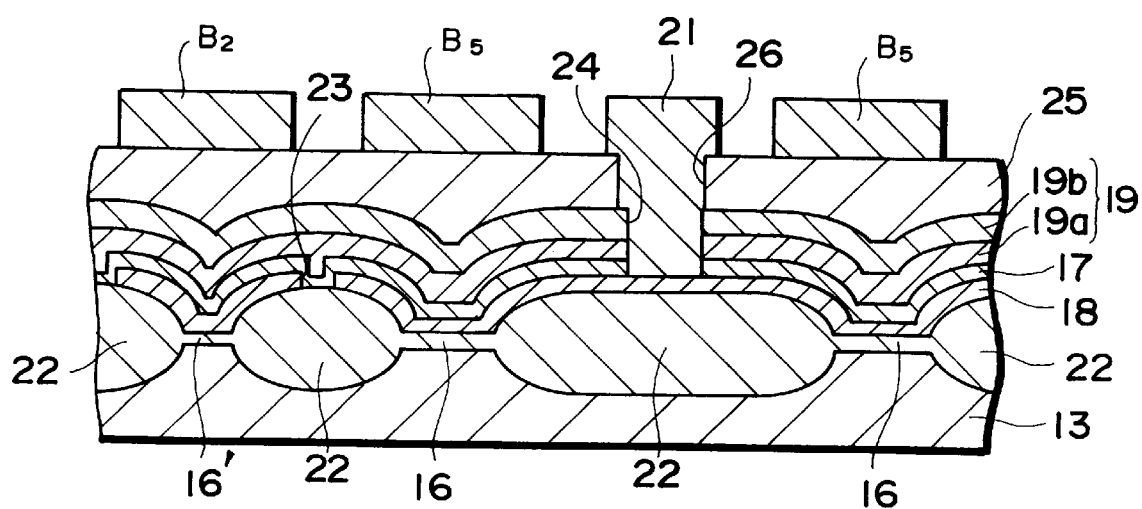
FIG. 9 is a sectional view taken along the line IX—IX shown in FIG. 8.

FIG. 9 is a sectional view taken along the line IX—IX shown in FIG. 8. In FIG. 9. those functional parts same as mentioned above are designated by the same reference numerals as used in FIGS. 1 to 7.

As shown in FIG. 9, in the fourth embodiment, the gate insulating film portions 16 are shown on both sides of an isolation region 22. Though not shown in FIG. 9, the selector transistors 12 are formed in pairs on the gate insulating film 16 across the insulating film 22.

The floating-gate conductive layers 18 and the control-gate conductive layers 19 of a pair of selector transistors 12 are connected together by a connector 21 formed between the pair of selector transistors 12. Therefore, the conductive layers 18 and 19 of the pair of selector transistors 12 function as a gate g2 in one body.

A selector transistor 12 on one side of the connector 21 selects the memory elements 11 under the bit lines B1 and B2 located on the one side, and a selector transistor 12 on the other side of the connector 21 selects the memory elements 11 under the bit line B3 on the other side.

In the fourth embodiment, one connector 21 is shared by a pair of selector transistors 12 located on both sides thereof, so that the structure and the manufacturing process of the semiconductor memory 10 can be simplified, and this is extremely advantageous for increasing the components packaging density of the semiconductor memory 10.

<Fifth Embodiment>

In the first to the fourth embodiments mentioned above, the selector transistor 12 has been formed as a MOS transistor having a gate made by electrically connecting together the floating-gate conductive layer 18 and the control-gate conductive layer 19 of the selector transistor 12.

Figure 10:
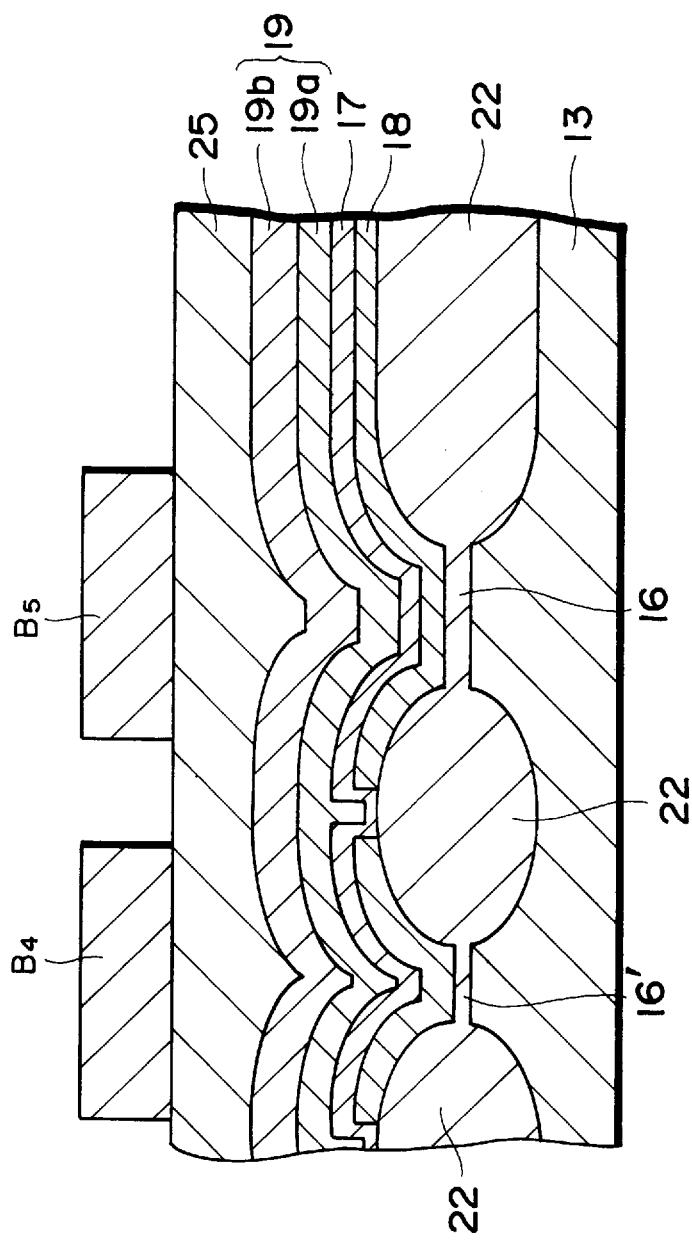
FIG. 10 is a sectional view showing yet another embodiment of the semiconductor memory according to the present invention.

In contrast to the other embodiments, in this embodiment, as shown in FIG. 10, the selector transistor 12 may be formed as a MOS transistor having a floating gate g3 composed of a floating-gate conductive layer 18 and a control gate g1 composed of a control-gate conductive layer 19 without connecting the floating-gate conductive layer 18 and the control-gate conductive layer 19 unlike those connected in the memory element 11.

The floating gate g3 as a component in the selector transistor 12 goes into the uncharged state by abstracting the charge by radiating an ultraviolet ray to the floating gate g3.

Therefore, when a voltage is applied to the control gate g1 formed by a control-gate conductive layer 19 connected integrally with the word lines W1 to W4 as mentioned above, since the floating gate g3 is in the uncharged state, a channel is formed between the source region 14 and the drain region 15 of the selector transistor 12, and the selector transistor 12 goes into the conducting state.

When the applied voltage to the control gate g1 is removed, the channel disappears between the source region 14 and the drain region 15 of the selector transistor 12, and the selector transistor 12 goes into the nonconducting state.

Therefore, the selector transistor 12 performs the same function as the selector transistors 12 in the first to the fourth embodiments without the connector 21 formed as shown in those embodiments.

Accordingly, this embodiment obviates the need to provide the connector 21 in the selector transistor 12, and perform all the processes related to the formation of the connector 21, and therefore it is possible to realize a semiconductor memory in a far simpler and more compact structure than in the prior art, and produce a semiconductor memory at extremely low cost.

The arrangement of the memory element and the selector transistor of a semiconductor memory according to the present invention is not limited to those illustrated, but many changes and variations may be made to it. In addition, the numeric values and the materials shown in the description of the manufacturing processes are illustrative and other appropriate values and materials may be selected.

According to the method of manufacturing a semiconductor memory according to the present invention as set forth in Claim 1, as mentioned above, the first and second contact holes are formed simultaneously with the working process, including photolithography, a fact which makes it possible to dispense with therefore the special-purpose mask, and photolithographic and etching processes only for the contact holes, and simplify the manufacturing process. Moreover, it is possible to adopt a single metal layer structure for the control-purpose conductive layer, and by this adoption of the single layer structure, it becomes possible to further simplify the structure and the manufacturing process of the semiconductor memory.

According to the method of manufacturing a semiconductor memory according to the present invention as set forth in Claim 6, as mentioned earlier, by batch patterning of the control gates and the first contact holes with one mask pattern, it becomes possible to obviate the necessity to consider allowable errors in relative positioning of the word lines and the first contact holes in the photolithographic process, which must be considered when patterning is done twice successively. Consequently, it is possible to diminish the space provided for such allowable errors and reduce the size of the semiconductor memory 10.

According to the semiconductor memory according to the present invention as set forth in Claim 7, as mentioned above, a connector for connecting the floating-gate conductive layers and the control-gate conductive layers is shared by a set of two selector transistors sharing one word line, and therefore it is not necessary to provide discrete connectors as many as the selector transistors, but the number of connectors provided in the conventional fabrication process can be reduced to half, so that the manufacturing process can be simplified and the semiconductor memory can be decreased in size.

According to the semiconductor memory according to the present invention as set forth in Claim 8, as described before, since a selector transistor with the floating gate in the nonconducting state can perform the same function as the conventional selector transistor, a selector transistor can be fabricated without forming a connector or the like to short-circuit the control gate and the floating gate, and therefore the structure and the manufacturing process of the semiconductor memory can be made simple.

What is claimed is:

1. A method of manufacturing a semiconductor memory including a plurality of memory elements arranged in a matrix formation on a semiconductor substrate, each memory element having a floating gate and a control gate, and selector transistors, each provided with a gate, for selecting said memory elements, comprising the steps of:

forming a floating-gate conductive layer, an intergate insulating layer, and a control-gate conductive layer on a semiconductor substrate, including a memory element region portion and a selector transistor region portion in each active region of said semiconductor substrate;

in conjunction with patterning of control gates forming each word line by preferential etching of said control-gate conductive layers, said intergate insulating film, and said floating-gate conductive layers, forming a first contact hole passing through said control-gate conductive layer and opening above said intergate insulating layer in that portion of said control gate which is close to each said selector transistor region portion;

forming source and drain regions in each said memory element region portion and in each said selector transistor region portion;

after covering the surface of said substrate with an interlayer insulating film, forming a drain contact hole passing through said interlayer insulating film and opening to each said drain region, and simultaneously forming a second contact hole passing through said first contact hole portion and said intergate insulating layer and opening to each said floating-gate conductive layer; and forming bit lines each passing through said drain contact hole and contacting to said drain region, and simultaneously forming a connector passing through said first and second contact holes and connecting said floating-gate conductive layer and said control-gate conductive layer together in each selector transistor.

2. A method of manufacturing a semiconductor memory according to claim 1, wherein said bit lines and said connectors are formed by sputtering a metal material using a mask.

3. A method of manufacturing a semiconductor memory according to claim 1, wherein said control-gate conductive layer has a double-layer structure formed by depositing a metal conductive layer portion on a polysilicon conductive layer portion doped with impurities.

4. A method of manufacturing a semiconductor memory according to claim 1, wherein the top end bore diameter of said second contact hole is larger than the bore diameter of said first contact hole, and said second contact hole is formed by etching using an etchant more effective to an insulating material than a metallic material.

5. A method of manufacturing a semiconductor memory according to claim 1, wherein said first and second contact holes are formed coaxially with respect to each other.

6. A method of manufacturing a semiconductor memory including a plurality of memory elements arranged in a matrix formation on a semiconductor substrate, each memory element having a floating gate and a control gate, and selector transistors, each provided with a gate, for selecting said memory elements, comprising the steps of;

forming a floating-gate conductive layer, an intergate insulating layer, and a control-gate conductive layer on a semiconductor substrate, including a memory element region portion and a selector transistor region portion in each active region partitioned by an isolation region of said semiconductor substrate;

patterning control gates forming each word line by preferential etching of said control-gate conductive layers, said intergate insulating film, and said floating-gate conductive layers, and simultaneously forming a first contact hole passing through the control-gate conductive layer, said intergate insulating layer and said floating-gate conductive layer, and opening above said isolation region in that portion of said control gate which is close to each said selector transistor region portion;

forming source and drain regions in each said selector transistor region portion and in each said selector transistor region portion;

after covering the surface of said substrate with an interlayer insulting film, forming a drain contact hole passing through said interlayer insulting film and opening to each said drain region, and simultaneously forming a second contact hole passing through said first contact hole portion and opening to each said isolation region; and forming bit lines each passing through said drain contact hole and contacting to said drain region, and simultaneously forming a connector passing through said first and second contact control-gate conductive layer together in each selector transistor.

\* \* \* \* \*